US012622229B2

(12) United States Patent
Dickson et al.

(10) Patent No.: US 12,622,229 B2
(45) Date of Patent: May 5, 2026

(54) STRUCTURE AND METHOD FOR TEST-POINT ACCESS IN A SEMICONDUCTOR

(71) Applicant: NXP USA, Inc., Austin, TX (US)

(72) Inventors: Kristofor Jason Dickson, Austin, TX (US); Hubert Martin Bode, Haar (DE); Swaminathan Subramanian, Austin, TX (US); Kent Bradley Erington, Austin, TX (US); Kurt Ulrich Neugebauer, Vaterstetten (DE); William Franklin Johnstone, Austin, TX (US)

(73) Assignee: NXP USA, Inc., Austin, TX (US)

( * ) Notice: Subject to any disclaimer, the term of this patent is extended or adjusted under 35 U.S.C. 154(b) by 904 days.

(21) Appl. No.: 17/817,260

(22) Filed: Aug. 3, 2022

(65) Prior Publication Data

US 2024/0047281 A1      Feb. 8, 2024

(51) Int. Cl.
*H01L 21/66* (2006.01)

(52) U.S. Cl.
CPC .............. *H01L 22/34* (2013.01); *H01L 22/14* (2013.01)

(58) Field of Classification Search
CPC ................................ H01L 22/34; H01L 22/14
USPC .......................................................... 438/13
See application file for complete search history.

(56) References Cited

U.S. PATENT DOCUMENTS

| | | | |
|---|---|---|---|
| 6,020,746 A | 2/2000 | Livengood | |
| 6,518,571 B2 * | 2/2003 | Talbot ..................... | H01L 22/12 |
| | | | 850/10 |

| | | | | |
|---|---|---|---|---|
| 10,777,472 B1 | 9/2020 | Lam et al. | | |
| 10,978,438 B1 | 4/2021 | Lam et al. | | |
| 2001/0006233 A1 | 7/2001 | Vallett | | |
| 2007/0293052 A1 * | 12/2007 | Le Roy ............... | H01L 21/3065 |
| | | | 438/708 |
| 2010/0116977 A1 * | 5/2010 | Young ................. | H01J 37/3056 |
| | | | 250/311 |
| 2010/0267234 A1 * | 10/2010 | Hayat ............... | H01L 21/32131 |
| | | | 257/E21.585 |
| 2016/0090296 A1 * | 3/2016 | Baillin .................... | B81B 7/007 |
| | | | 257/774 |
| 2019/0172680 A1 | 6/2019 | Fuller et al. | | |

(Continued)

FOREIGN PATENT DOCUMENTS

CN          112366143 A  *  2/2021  ............. H01L 21/56

OTHER PUBLICATIONS

Bajdechi, O. et al.; "A 1.8V Az Modulator Interface for Electret Microphone with On-Chip Reference"; IEEE 2001 Custom Integrated Circuits Conference, 2001, 4 pages.

(Continued)

*Primary Examiner* — Igwe U Anya

(57) ABSTRACT

One example discloses a test-point access structure within a semiconductor, including: a target test-point configured to be coupled to a circuit within the semiconductor; a first doped region within the semiconductor configured to generate a first signal in response to an energy beam transmitted by a circuit editing (CE) tool; a second doped region within the semiconductor configured to generate a second signal in response to the energy beam transmitted by the CE tool; and a target pad coupling the target test-point to the first doped region; wherein the CE tool is configured to remove material from the semiconductor in response to the first signal and the second signal.

19 Claims, 6 Drawing Sheets

(56) References Cited

U.S. PATENT DOCUMENTS

| | | |
|---|---|---|
| 2021/0098228 A1 | 4/2021 | Vickers et al. |
| 2022/0122805 A1 | 4/2022 | Pawlowicz |

OTHER PUBLICATIONS

Zare-Hoseini, Hashem et al.; "A Low-Power Continuous-Time $\Delta\Sigma$ Modulator for Electret Microphone Applications"; IEEE Asian Solid-State Circuits Conference Nov. 8-10, 2010, Beijing, China, 4 pages.

ThermoFisher Scientific; "OptiFIB Taipan G2+ System Circuit edit solution for 7 nm and beyond"; 2pgs; 2020.

Semiconductor Digest; "DCG Systems extends circuit edit capability to the 10nm node with the introduction of OptiFIB Taipan"; Retrieved from the internet https://sst.semiconductor-digest.com/2015/09/dcg-systems-extends-circuit-edit-capability-to-the-10nm-node-with-the-introduction-of-optifib-taipan/ ; 2 pp. Aug. 3, 2022.

ThermoFisher Scientific; "Centrios Circuit Edit Systems"; Retrieved from the internet https://www.thermofisher.com/us/en/home/electron-microscopy/products/circuit-edit-systems/centrios.html ; 6 pp. Aug. 3, 2022.

Eurofins-EAG Laboratories; "FIB Circuit Edit & Debug"; Retrieved from the internet https://www.eag.com/services/engineering/fib-circuit-edit-debug/ ; 4pgs Aug. 3, 2022.

\* cited by examiner

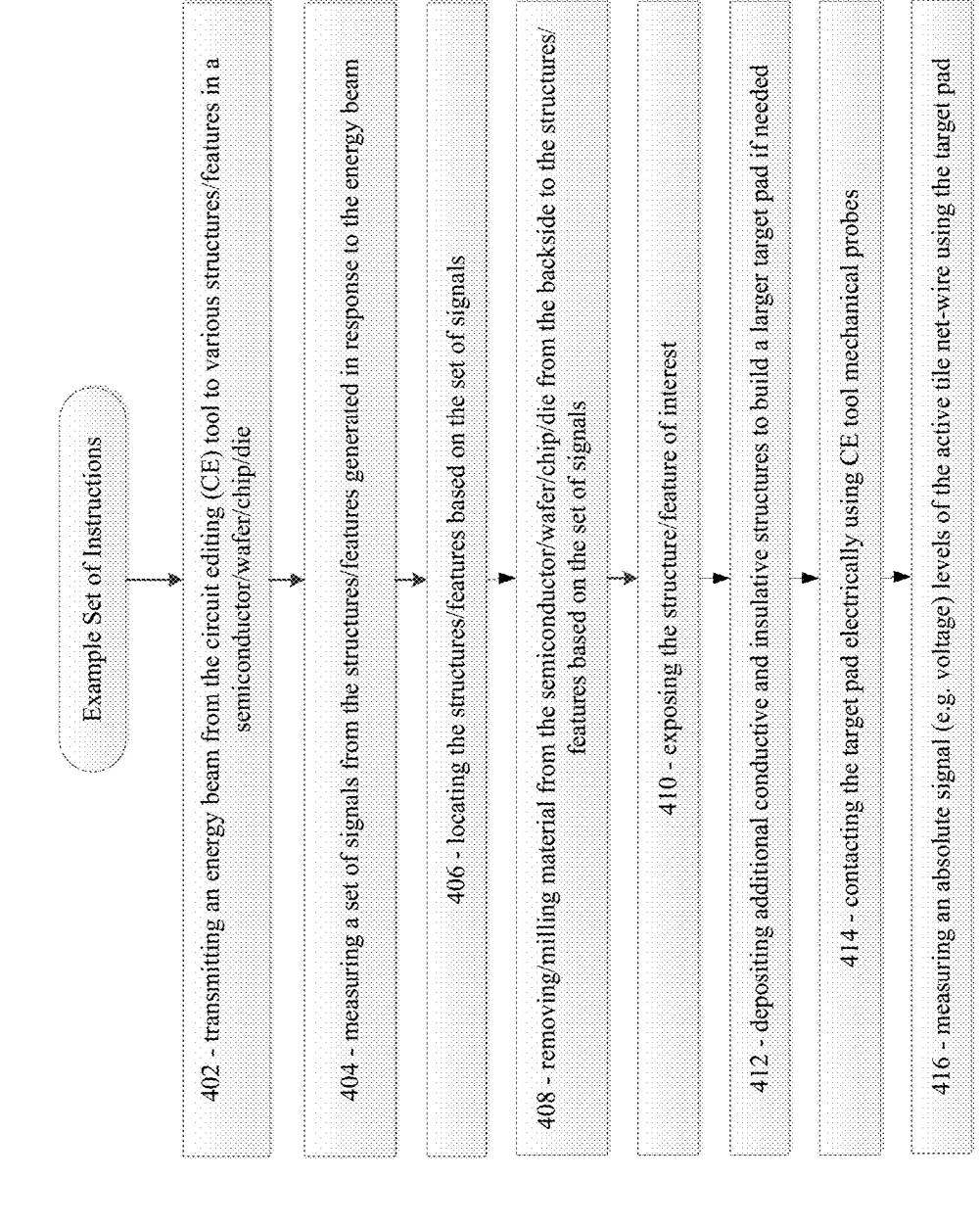

Example Set of Instructions

402 - transmitting an energy beam from the circuit editing (CE) tool to various structures/features in a semiconductor/wafer/chip/die 404 - measuring a set of signals from the structures/features generated in response to the energy beam 406 - locating the structures/features based on the set of signals 408 - removing/milling material from the semiconductor/wafer/chip/die from the backside to the structures/features based on the set of signals 410 - exposing the structure/feature of interest 412 - depositing additional conductive and insulative structures to build a larger target pad if needed 414 - contacting the target pad electrically using CE tool mechanical probes 416 - measuring an absolute signal (e.g. voltage) levels of the active tile net-wire using the target pad

STRUCTURE AND METHOD FOR TEST-POINT ACCESS IN A SEMICONDUCTOR

The present specification relates to systems, methods, apparatuses, devices, articles of manufacture and instructions for test-point access in a semiconductor.

SUMMARY

According to an example embodiment, a test-point access structure within a semiconductor, the structure comprising: a target test-point configured to be coupled to a circuit within the semiconductor; a first doped region within the semiconductor configured to generate a first signal in response to an energy beam transmitted by a circuit editing (CE) tool; a second doped region within the semiconductor configured to generate a second signal in response to the energy beam transmitted by the CE tool; and a target pad coupling the target test-point to the first doped region; wherein the CE tool is configured to remove material from the semiconductor in response to the first signal and the second signal.

In another example embodiment, the CE tool is a focused ion-beam (FIB) device; and the first and second signals are generated in response to an ion energy beam emitted from the FIB device.

In another example embodiment, the circuit editing (CE) tool transmits the energy beam to a backside of the semiconductor.

In another example embodiment, when the first signal exceeds a threshold value, then the CE tool is configured to stop removing a first set of material having a first cross-sectional area from the semiconductor.

In another example embodiment, when the second signal exceeds a threshold value the CE tool is configured to stop removing a second set of material having a second cross-sectional area from the semiconductor.

In another example embodiment, the second cross-sectional area is smaller than the first cross-sectional area.

In another example embodiment, the target test-point is coupled to a conducting net-wire within the circuit.

In another example embodiment, the test-point access structure is placed in a spare tiling region of the semiconductor.

In another example embodiment, the first doped region is a first Nwell structure; and the circuit is not galvanically coupled to the first Nwell structure.

In another example embodiment, the second doped region is a second Nwell structure; and the second Nwell structure is galvanically coupled to the circuit.

In another example embodiment, the first signal from the first Nwell structure is detected earlier than the second signal from the second Nwell structure.

In another example embodiment, the first Nwell structure is a floating Nwell.

In another example embodiment, the target pad is configured to be in temporary physical contact with a mechanical test-probe.

In another example embodiment, the target pad is configured to be in temporary electrical contact with a mechanical test-probe; and the test-probe is configured to measure an absolute voltage or current at the target test-point.

In another example embodiment, the target pad is configured to be in temporary physical contact with a mechanical test-probe.

In another example embodiment, the semiconductor includes a set of active tiles that are part of the circuit and a set of spare tiles that are unused by the circuit.

In another example embodiment, the set of spare tiles are in the second set of material in the first doped region and are configured to be removed by the CE tool during milling.

In another example embodiment, the set of active tiles are in the second doped region and are not removed by the CE tool during milling.

According to an example embodiment, a method of enabling a circuit editing (CE) tool to physically probe a semiconductor using a test-point access structure: wherein the test-point access structure comprises, a target test-point configured to be coupled to a circuit within the semiconductor; a first doped region within the semiconductor; a second doped region within the semiconductor; a target pad coupling the target test-point to the first doped region; and wherein the method comprises, distributing a set of instructions, stored on a non-transitory, tangible computer readable storage medium, for configuring the circuit editing (CE) tool; wherein the instructions include, transmitting an energy beam from the circuit editing (CE) tool; measuring a first signal from the first doped region generated in response to the energy beam; measuring a second signal from the second doped region generated in response to the energy beam; and removing material from the semiconductor in response to the first signal and the second signal.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

BRIEF DESCRIPTION OF THE DRAWINGS

FIG. 4 represents an example process for accessing the test-point access structure.

Figure 1:
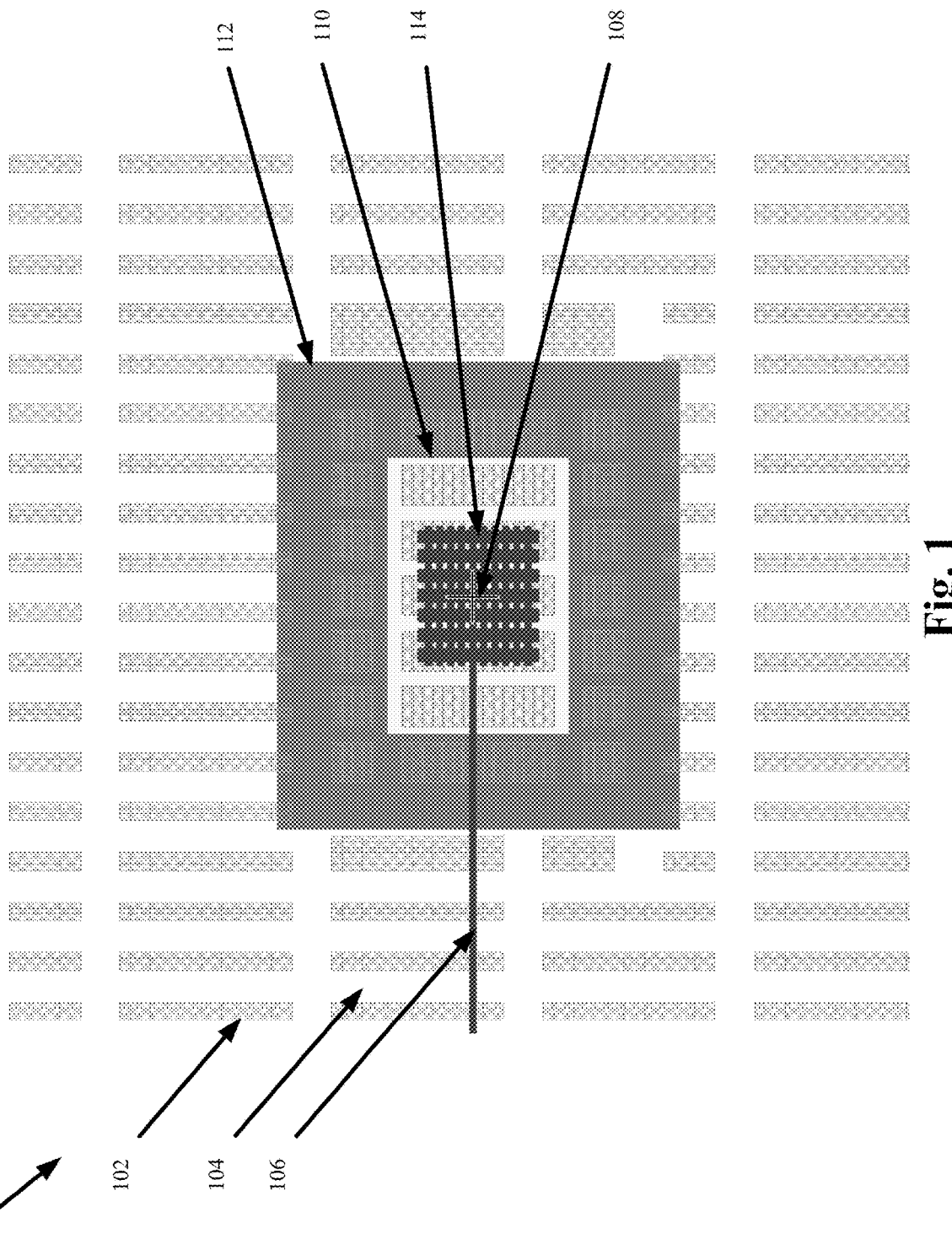
FIG. 1 represents an example plan view of a test-point access structure within a semiconductor.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

During silicon wafer, chip, die, etc. testing, there are times when specific internal signals on specific test-points (e.g. net-wires, circuit traces, metal layers, signal lines, etc.) must be physically probed using mechanical contact probes for example to determine if correct voltages or other signal are present on one or more test-points. CE tools (e.g. FIB) need help accessing a "particular net" (i.e. test-point) without damage to other "nets" (i.e. chip's network of wires).

Focused Ion Beam (FIB) circuit edit (CE) tools are available to expose various test-points from either a front or back side of the wafer, chip or die during evaluation, debugging, and/or failure testing. For example, chemical assisted Ga+ FIBs are used to remove/deposit conductor/insulator materials.

However, as transistor and interconnect routing shrink with each new process node (i.e. minimum feature size such as 5 nm), due to increasing chip complexity and thus congestion of a greater number of metal layers routed above and/or below a target test-point, CE tools can lack enough spatial resolution and accuracy to accurately mill to and expose various process node sized target sites.

While optical lasers can be used to probe switching transistors (e.g. for delay time etc.) they cannot measure an "absolute voltage" in the chip (e.g. analog signals such as nbias, pbias, bandgap_ref, bandgap_status, startup_en, etc.), and perhaps upgrading CE tools at great cost but with minimal gains can be unsustainable. Also optical lasers cannot be used to measure I/V curves of nodes. Alternatively FIB pads are needed to measure "load curves" that help diagnose failures better than just the measuring voltage level on the node.

Now discussed is a test-point access structure (e.g. custom library cell) and method for accessing said structure that can be placed in the wafer/chip/die in unused areas such as spare tiling regions that do not use up valuable die space while simultaneously enabling CE tools to access structures/test-points/etc. that are smaller than the CE tools were designed to access.

This test-point access structure and method for accessing enables the CE tools to locate a target test-point, define various milling (i.e. material removal) end points, and thus provide physical/mechanical CE tool access (e.g. perhaps using a test-probe) to such test-points from either a front or back side of the wafer/chip/die without shorting to or causing damage to adjacent cells.

The test-point access structure enables failure analysis CE toolsets to continue to remain effective beyond their inherent energy (e.g. optical scanning, milling, etc.) beam resolution limits. For example, various embodiments of the test-point access structure can make advanced CMOS nodes compatible with existing CE tools. Thus the test-point access structure enables existing CE tools access to chosen internal nets, and to future proof them by ensuring they can locate and expose probe target nets of interest on future technologies.

FIG. 1 represents an example 100 plan view of a test-point access structure within a semiconductor. The example 100 structure is embedded within a semiconductor wafer/chip/die/etc. having various test-points to be accessed and/or tested using various CE tools, such as a mechanical contact voltage probe.

The example 100 structure is placed within and/or includes: a set of active tiles 102 (e.g. functional circuits, other active structures, etc.); a set of spare tiles 104 (e.g. unused or non-functional areas, that can also be used for CE tool alignment) or other structures; a conducting net-wire 106 (e.g. a conductive trace is routed from a test point to an internal net of interest) hosting one or more signals to be physically probed; a target test-point 108 coupled to the conducting net-wire or trace 106; a first doped region 110 (e.g. floating Nwell which provides isolation to circuits in the silicon wafer/chip/die/etc., large enough to be detected by a CE tool test-probe as it mills trenches to the test probe and stops using voltage contrast imaging or similar techniques); a second doped region 112 (e.g. functional Nwell which is electrically/galvanically coupled to circuits in the silicon wafer/chip/die/etc., also detectable by the CE tool); a target pad 114. The target pad 114 in many example embodiments is a metal structure dense/strong enough to stop FIB milling so that the FIB does not punch through and robust enough to support physical connection to FIB deposited conductor post milling (e.g. a metal waffle structure) that is configured for temporary physical contact with the CE test-probe.

Figure 2:
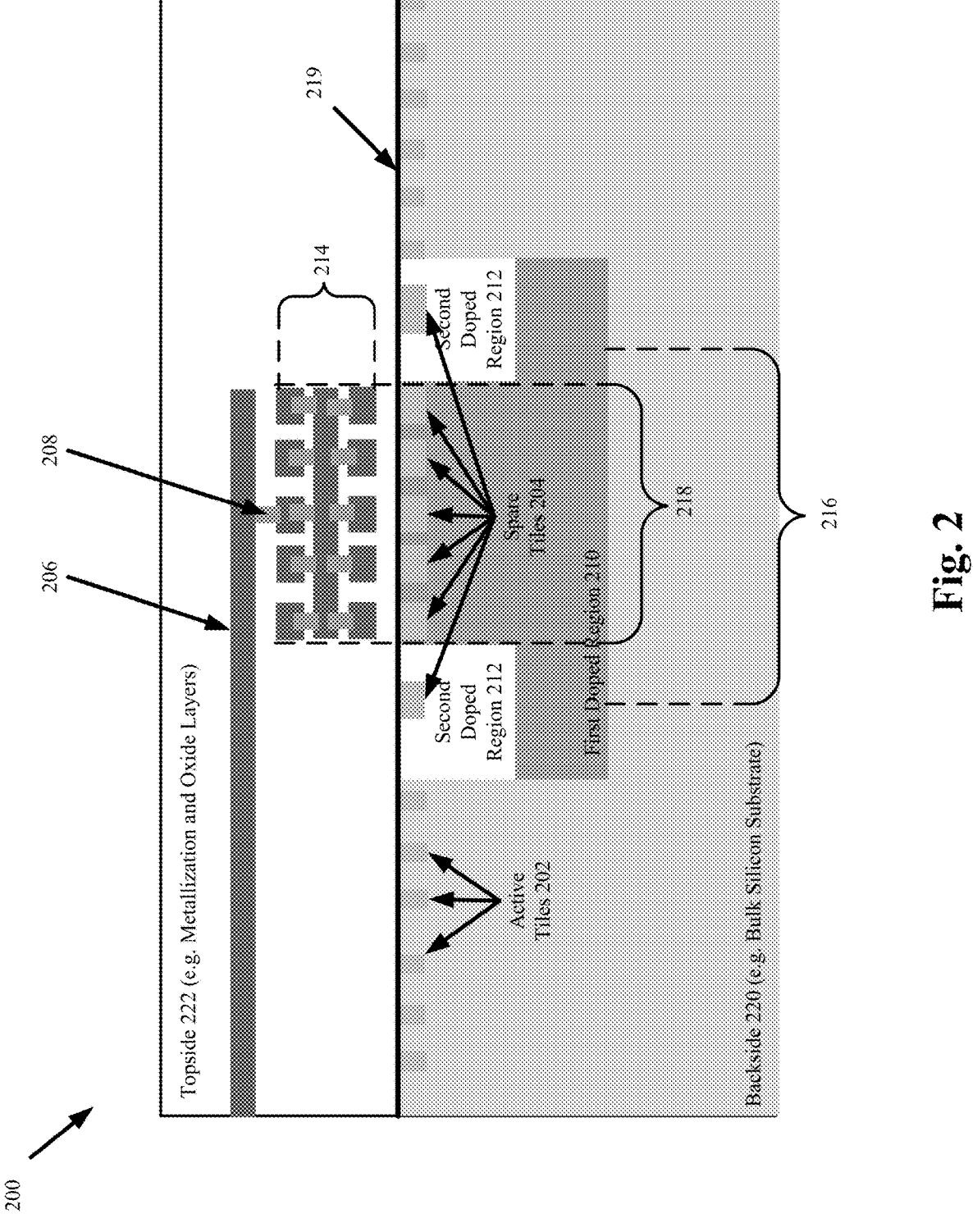
FIG. 2 represents a first example side view of the test-point access structure.

FIG. 2 represents a first example 200 side view of the test-point access structure. The example 200 structure is also embedded within the semiconductor wafer/chip/die/etc.

The example 200 structure is placed within and/or includes: a set of active tiles or other structures 202 (e.g. functional circuits); a set of spare tiles or other structures 204 (e.g. unused or non-functional areas, that can also be used for CE tool alignment); a conducting net-wire 206 hosting one or more signals to be physically probed; a target test-point 208 coupled to the conducting net-wire 206; a first doped region 210 (e.g. floating Nwell, large enough to be detected by a CE tool test-probe while milling a trench to the test probe using voltage contrast imaging or similar techniques); a second doped region 212 (e.g. functional Nwell, also detectable by the CE tool); a target pad 214 (e.g. metal waffle structure configured for temporary physical contact with the CE test-probe).

Additionally, the example 200 structure includes: a milled trench region 216 (e.g. a first set of material having a first cross-sectional area that is configured to be removed by CE tool milling); and a milled hole region 218 (e.g. a second set of material having a second cross-sectional area that is configured to be removed by CE tool milling that stops at an ODI layer 219). In some example embodiments, the ODI layer defines a boundary between the front end silicon and back end metallization and signal routing layers.

As shown in this example 200 the set of spare tiles 204 are in the second set of material in the first doped region 210 and the milled hole region 218 and are configured to be removed by the CE tool during milling. Whereas, the set of active tiles 202 in the second doped region 212 and are not removed by the CE tool during milling.

In this example, the milled trench region 216 and the milled hole region 218 are removed/milled by the CE tool from a backside 220 (e.g. bulk silicon substrate) of the semiconductor wafer/chip/die. A topside 222 (e.g. metallization and oxide layers) is not milled in this example 200.

In some example embodiments either or both doped regions 210, 212 are deep Nwells that also function as markers/guides for the CE tool during material removal/milling/grinding. Due to the differences in the Nwells, a first signal from the first Nwell structure in response to an energy beam transmitted by a circuit editing (CE) tool is detected earlier than a second signal from the second Nwell structure. For example, a FIB CE tool can remove material from the backside 220 to tunnel to the target pad 214. The FIB CE tool uses electrical contrast imaging to locate the deep Nwell as a stop milling (e.g. etch stop) indicator since the deep Nwell will show a strong voltage contrast difference vs bulk silicon in response to an energy beam (e.g. ion beam) transmitted by the CE tool to the backside 220 of the semiconductor/wafer/chip/die. Once milling reaches the deep Nwell, CE tool X, Y and Z navigation to the target pad 214 is established. Now the FIB CE tool can mill a micro via access cut (e.g. milled hole region 218) to the target pad 214

(e.g. metal waffled pad structure) from the ODI layer 219 etch stop position at the base of the deep Nwell.

In some example embodiments, additional steps of applying oxide-insulator and metal-conductor depositions are used to form an electrical conductive pipe from the backside 220 to the target pad 214. Then a much larger CE tool mechanical contact probe pad can be deposited for easier CE tool microprobe access such that analog voltage levels at the target test-point 208 corresponding to operational internal signals electrically connected using the conducting net-wire 206 can be directly measured.

Figure 3:
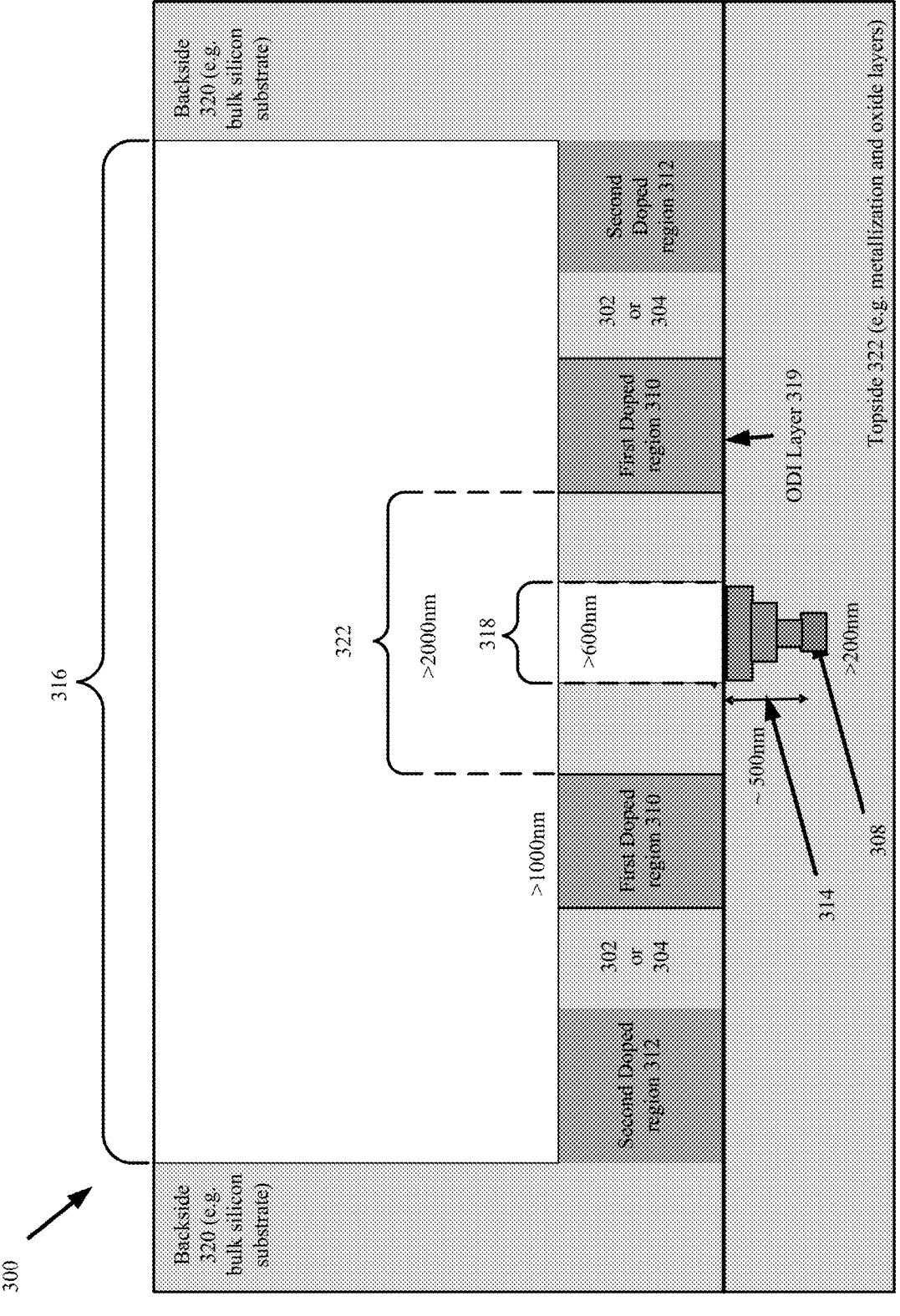
FIG. 3 represents a second example side view of the test-point access structure.

FIG. 3 represents a second example 300 side view of the test-point access structure. The example 200 structure is also embedded within the semiconductor wafer/chip/die/etc.

The example 300 structure is placed within and/or includes: a set of active tiles 302 (e.g. functional circuits); a set of spare tiles 304 (e.g. unused or non-functional areas, that can also be used for CE tool alignment); a conducting net-wire (not shown) hosting one or more signals to be physically probed; a target test-point 308 coupled to the conducting net-wire (e.g. an internal target signal net-wire of interest); a first doped region 310 (e.g. floating Nwell, large enough to be detected by a CE tool test-probe); a second doped region 312 (e.g. functional Nwell, also detectable by the CE tool); a target pad 314 (e.g. metal waffle structure configured for temporary physical contact with the CE test-probe).

Additionally, the example 300 structure includes: a milled trench 316 (e.g. here a first set of material having a first cross-sectional area has already been removed by CE tool milling); and a milled hole 318 (e.g. a second set of material having a second cross-sectional area that has already been removed by CE tool milling that stops at an ODI layer 319).

In this example, the milled trench region 316 and the milled hole region 218 have been removed/milled by the CE tool from a backside 320 (e.g. bulk silicon substrate) of the semiconductor water/chip/die. A topside 322 (e.g. metallization and oxide layers) is not milled in this example 300. In some example embodiments an optional additional buffer zone 322 (e.g. Pwell) can be added around the milled hole 318 as shown.

Example dimensions are as shown and discussed below, but in other example embodiments may be different. For example: the target pad 314 may have an "optimum" 200 nm×200 nm, or "minimum" 125 nm×125 nm dimension; the milled trench 316 may be 20-300 µm wide and 20-200 µm deep; the milled hole 318 may have an "optimum" 600 nm×600 nm, or "minimum" 350 nm×350 nm dimension. These dimensions and keep out areas can vary depending upon a particular set of CE tools being used during testing.

FIG. 4 represents an example 400 process for accessing the test-point access structure. The order in which the process is discussed does not limit the order in which other example embodiments implement the instructions unless otherwise specifically stated. Additionally, in some embodiments some process steps may be implemented concurrently.

The example 400 process begins in 402, by transmitting an energy beam from the circuit editing (CE) tool to various structures/features in a semiconductor/wafer/chip/die.

The energy beam (e.g. an ion beam from a FIB device) is set to a probe size capable of imaging structures/features (such as at least one of a target test-point, a target pad, a first doped region, and/or a second doped region) in the test-point access structure.

CE tool energy beams enable the CE tools to see features/elements/structures further into the semiconductor/wafer/ chip/die, however at a larger probe size there is also a lower resolution of what features/elements/structures can be detected.

The CE tool energy beams can be used to simultaneously image and mill structures/features. For example, when milling/ablating/removing a semiconductor substrate using a FIB charged ions are transmitted to the structures/features. Structures/features such as an implanted isolated Nwells will be "charged up" by the ions similar to how a capacitor charges. These "charged" structures/features then begin to reflect the electrons generated by the energy beam's ions back to the CE tool which the CE tool then uses for imaging the structures/features. As the energy beam gets closer to such structures/features, a voltage-contrast measurement generated by the CE tool increases resulting in a clearer image of the structures/features.

Next in 404, measuring a set of signals (e.g. charge stored, electron beam absorption/secondary emission and charge effects, etc.) from the structures/features generated in response to the energy beam.

In 406, locating the structures/features based on the set of signals.

In 408, removing/milling material from the semiconductor/wafer/chip/die from the backside to the structures/features based on the set of signals.

Based on the set of signals, the CE tool operator will know to stop at a correct depth (e.g. before exposing a transistor active layer in the semiconductor). For example, a first milling operation for removing a first set of material having a first cross-sectional area from the semiconductor can stop when a first signal exceeds a threshold value. Also a second milling operation for removing a second set of material having a second cross-sectional area from the semiconductor can stop when a second signal exceeds a threshold value. The CE tool can use the enhanced voltage-contrast provided by the Nwell implants during milling to fine tune the CE tool milling alignment in order to center the CE tool over structures/features such as the target test-point and/or target pad without causing damage to neighboring active tiles/cells.

Then in 410, exposing the structure/feature of interest (e.g. target pad or target test-point that is connected to the conducting net-wire of interest).

In 412, depositing additional conductive and insulative structures to build a larger target pad if needed.

In 414, contacting the target pad electrically using CE tool mechanical probes.

And then in 416, measuring an absolute signal (e.g. voltage) levels of the conducting net-wire using the target pad.

Figure 5:
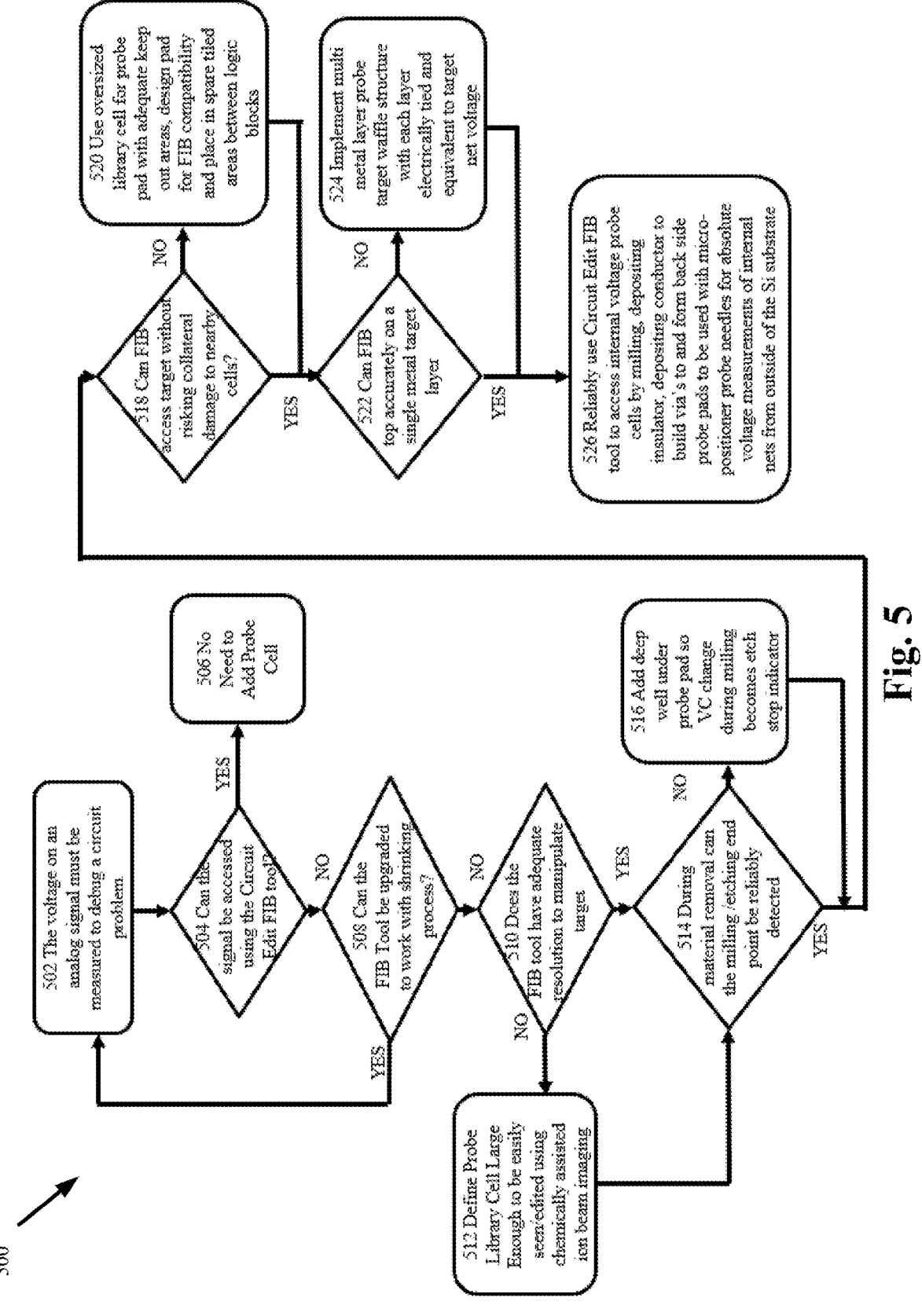
FIG. 5 represents an example process for fabricating the test-point access structure.

FIG. 5 represents an example 500 process for fabricating the test-point access structure. The example 500 process is as follows: 502, a voltage on an analog signal must be measured to debug a circuit problem; 504 can the signal be accessed using the Circuit Edit FIB tool?; if yes then in 506 no need to add a probe cell (i.e. test-point access structure); if no, then in 508 can the FIB tool be upgraded to work with shrinking process?; if yes then return to 502; if no then in 510 does the FIB tool have adequate resolution to manipulate target?; if no then in 512 define a probe library cell large enough to be easily seen/edited using chemically assisted ion beam imaging; if yes then in 514 during material removal can the milling/etching end point be reliably detected?; if no then in 516 add deep well under probe pad so VC change during milling becomes etch stop indicator; if yes then in 518 can FIB access target without risking collateral damage to nearby cells?; if no then in 520 use oversized library cell for probe pad with adequate keep out areas, design pad for FIB compatibility and place in spare tiled areas between logic blocks; if yes then in 522 can FIB stop accurately on a single metal target layer?; if no then in 524 implement multi-metal layer probe target waffle structure with each layer electrically tied and equivalent to target net voltage; if yes then in 526 reliably use CE FIB tool to access internal voltage probe cells by milling, depositing insulator, depositing conductor to build via's to and form back side probe pads to be used with micro-positioner probe needles for absolute voltage measurements of internal nets from outside of the semiconductor substrate.

Figure 6:
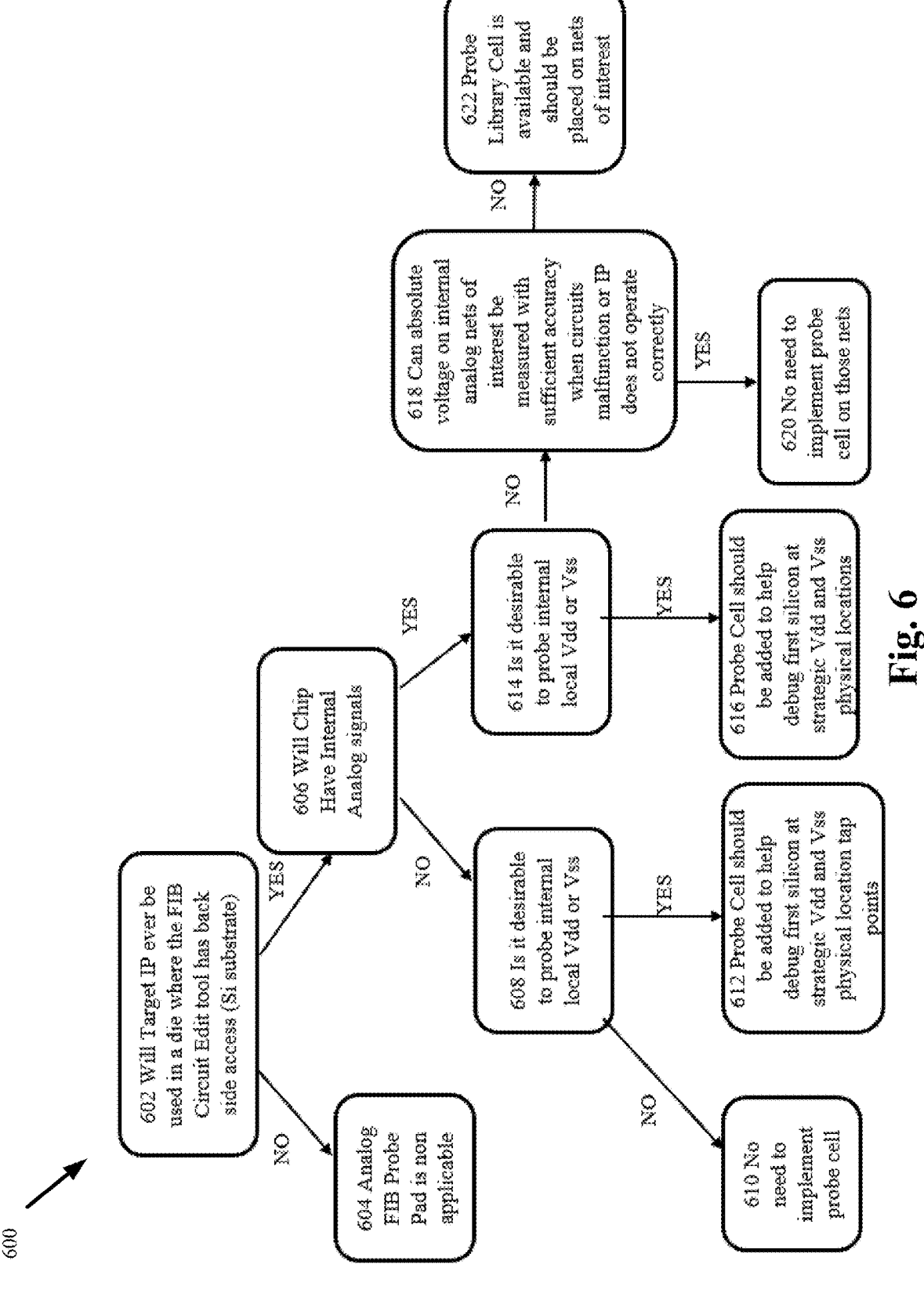
FIG. 6 represents an example process for employing the test-point access structure.

FIG. 6 represents an example process for employing the test-point access structure. The example 600 process is as follows: 602 will target IP be used in a die where the FIB CE tool has back side access (i.e. to the Silicon substrate)?; if no then in 604 analog FIB probe pad is not applicable; if yes then in 606 will chip have internal analog signals?; if no then in 608 is it desirable to probe internal local Vdd or Vss?; if no then in 610 no need to implement probe cell; if yes then in 612 probe cell should be added to help debug first silicon at strategic Vdd and Vss physical location tap points; if yes at 606 above then in 614 Is it desirable to probe internal local Vdd or Vss?; if yes then in 616 probe cell should be added to help debug first silicon at strategic vdd and vss physical locations; if no then in 618 can absolute voltage on internal analog nets of interest be measured with sufficient accuracy when circuits malfunction or IP does not operate correctly?; if yes then in 620 no need to implement probe cell on those nets; if yes then in 622 probe library cell is available and should be placed on nets of interest.

The above described test-point access structure and process for accessing fills a gap where existing laser voltage probe tools cannot determine the absolute node voltage during debug. It will allow direct measurement of absolute voltages on analog signals where a few mV offset can be the reason for defective circuit operation. Such failure modes are very difficult to debug without direct mechanical access to the nets of interest.

In some example applications, the test-point access structure and method can be based on an absolute set of resolution limits for an existing set of CE tools. The test-point access structure (e.g. analog probe cell) can thus be designed for compatibility with such CE tools, instead of designing a new CE tool to accommodate shrinking process node technology features.

For example, the test-point access structure can be designed to be implemented on 5 nm silicon and have features designed to make it useable with existing debug hardware. The test-point access structure can be made large enough to be identified using 1064 nm IR navigation lasers, and is embedded in Nwell for electrical isolation and end milling detection. Electrical connections and keep out areas are defined so that connection to a test pad can be achieved without collateral damage to other active tiles/circuits in the semiconductor/wafer/chip/die/etc.

Various tools, such as the CE tools just discussed, can be used to implement these process steps. Such tools can include an input/output data interface, a processor, a storage device, and a non-transitory machine-readable storage medium. A machine-readable storage medium can include instructions which control how the CE tool receives input data and transforms the input data into output data, using data for controlling the various process steps discussed above. The machine-readable storage medium in an alternate example embodiment is a non-transitory computer-readable storage medium. In other example embodiments the set of process steps described above can be implemented either using logic gates, application specific chips, firmware, as well as other hardware forms.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A test-point access structure within a semiconductor, the structure comprising:

a target test-point configured to be coupled to a circuit within the semiconductor;

a first doped region within the semiconductor configured to generate a first signal in response to an energy beam transmitted by a circuit editing (CE) tool;

a second doped region within the semiconductor configured to generate a second signal in response to the energy beam transmitted by the CE tool; and a target pad coupling the target test-point to the first doped region;

a void having an area defined by an amount of material removed by the CE tool in response to the first signal and the second signal;

wherein the target test-point is coupled to a conducting net-wire within the circuit.

2. The structure of claim 1:
wherein the CE tool is a focused ion-beam (FIB) device; and wherein the first and second signals are generated in response to an ion energy beam emitted from the FIB device.

3. The structure of claim 1:
wherein a backside of the semiconductor is configured to receive the energy beam.

4. The structure of claim 1:
wherein the void includes a first area defined by when the CE tool stopped removing a first set of material in response to the first signal exceeding a threshold value; and wherein the first set of material has a first cross-sectional area.

5. The structure of claim 4:
wherein the void includes a second area defined by when the CE tool stopped removing a second set of material in response to the second signal exceeding a threshold value; and wherein the second set of material has a second cross-sectional area.

6. The structure of claim 5:
wherein the second cross-sectional area is smaller than the first cross-sectional area.

7. The structure of claim 1:
wherein the test-point access structure is placed in a spare tiling region of the semiconductor.

8. The structure of claim 1:
wherein the first doped region is a first Nwell structure; and wherein the circuit is not galvanically coupled to the first Nwell structure.

9. The structure of claim 8:
wherein the second doped region is a second Nwell structure; and wherein the second Nwell structure is galvanically coupled to the circuit.

10. The structure of claim 9:
wherein the first Nwell structure is configured to enable the first signal to be detected earlier than the second signal from the second Nwell structure.

11. The structure of claim 8:
wherein the first Nwell structure is a floating Nwell.

12. The structure of claim 1:
wherein the target pad is configured to be in temporary physical contact with a mechanical test-probe.

13. The structure of claim 1:
wherein the target pad is configured to be in temporary electrical contact with a mechanical test-probe; and wherein the test-probe is configured to measure an absolute voltage or current at the target test-point.

14. The structure of claim 1:
wherein the target pad is configured to be in temporary physical contact with a mechanical test-probe.

15. The structure of claim 1:
wherein the semiconductor includes a set of active tiles that are part of the circuit and a set of spare tiles that are unused by the circuit.

16. The structure of claim 15:
wherein the set of spare tiles are in the second set of material in the first doped region and are configured to be removed by the CE tool during milling.

17. The structure of claim 15:
wherein the set of active tiles are in the second doped region and are not removed by the CE tool during milling.

18. Method of enabling a circuit editing (CE) tool to physically probe a semiconductor using a test-point access structure:
wherein the test-point access structure comprises,
a target test-point configured to be coupled to a circuit within the semiconductor;
a first doped region within the semiconductor;
a second doped region within the semiconductor;
a target pad coupling the target test-point to the first doped region; and
wherein the method comprises,
distributing a set of instructions, stored on a non-transitory, tangible computer readable storage medium, for configuring the circuit editing (CE) tool;
wherein the instructions include,
transmitting an energy beam from the circuit editing (CE) tool;
measuring a first signal from the first doped region generated in response to the energy beam;
measuring a second signal from the second doped region generated in response to the energy beam; and
removing material from the semiconductor in response to the first signal and the second signal;
wherein when the first signal exceeds a threshold value, then the CE tool is configured to stop removing a first set of material having a first cross-sectional area from the semiconductor; and
wherein when the second signal exceeds a threshold value the CE tool is configured to stop removing a second set of material having a second cross-sectional area from the semiconductor.

19. A test-point access structure within a semiconductor, the structure comprising:
a target test-point configured to be coupled to a circuit within the semiconductor;
a first doped region within the semiconductor configured to generate a first signal in response to an energy beam transmitted by a circuit editing (CE) tool;
a second doped region within the semiconductor configured to generate a second signal in response to the energy beam transmitted by the CE tool; and
a target pad coupling the target test-point to the first doped region;
a void having an area defined by an amount of material removed by the CE tool in response to the first signal and the second signal;
wherein the test-point access structure is placed in a spare tiling region of the semiconductor.

* * * * *